United States Patent
Lee et al.

(10) Patent No.: US 7,446,595 B2
(45) Date of Patent: Nov. 4, 2008

(54) CHARGE PUMP CIRCUIT WITH POWER MANAGEMENT

(75) Inventors: Chao-Cheng Lee, Science-Based Industrial Park (TW); Tzu-Chien Tzeng, Hsin Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 74 days.

(21) Appl. No.: 11/580,828

(22) Filed: Oct. 16, 2006

(65) Prior Publication Data

US 2007/0090864 A1    Apr. 26, 2007

(30) Foreign Application Priority Data

Oct. 17, 2005    (TW) ............................... 94136105 A (51) Int. Cl.
*G05F 3/02* (2006.01)
(52) U.S. Cl. .................. 327/536; 327/148; 327/157
(58) Field of Classification Search ............ 327/536, 327/589, 148, 157, 390; 326/88
See application file for complete search history.

(56) References Cited

U.S. PATENT DOCUMENTS

| | | | | |
|---|---|---|---|---|
| 6,094,078 A * | 7/2000 | Suzuki | ....................... | 327/156 |
| 6,278,333 B1 * | 8/2001 | Le et al. | ....................... | 331/17 |
| 6,611,161 B1 * | 8/2003 | Kumar et al. | ............... | 327/157 |
| 6,642,759 B1 * | 11/2003 | Hughes | ....................... | 327/157 |
| 6,876,238 B1 * | 4/2005 | Kelkar et al. | ................ | 327/157 |
| 7,057,465 B2 * | 6/2006 | Wakayama | .................. | 331/16 |

* cited by examiner

*Primary Examiner*—Lincoln Donovan
*Assistant Examiner*—Hai L. Nguyen
(74) *Attorney, Agent, or Firm*—Muncy, Geissler, Olds & Lowe, PLLC (57) ABSTRACT

This invention provides a charge pump circuit used in phase-locked loop (PLL) having the function of power management for portable application. According to different applications, power management adjusts the power consumption modes of this PLL that will also correspond to different jitter degree. There are three kinds of modes contained in the PLL: the first mode is normal mode having the larger power consumption and smaller jitter, second mode is low power mode having moderate power consumption and moderate jitter, and third mode is the traditional mode having the smaller power consumption and the larger jitter.

18 Claims, 8 Drawing Sheets

CHARGE PUMP CIRCUIT WITH POWER MANAGEMENT

BACKGROUND OF THE INVENTION (a) Field of the Invention

The invention relates to a charge pump, and particularly to a charge pump with power management.

(b) Description of the Related Art

Figure 1:
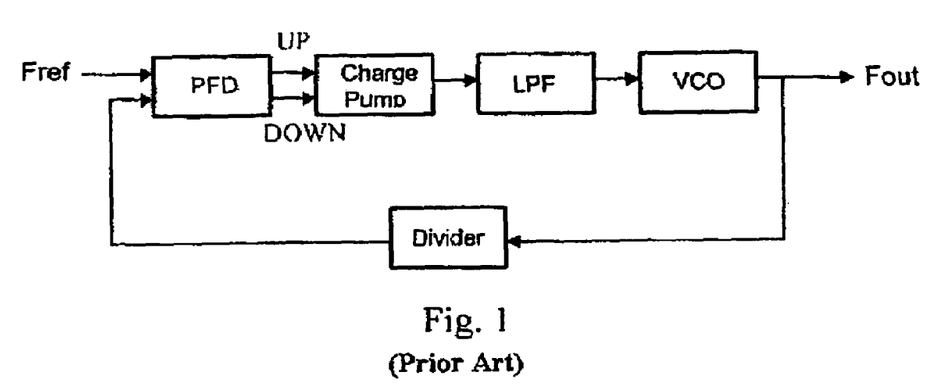
FIG. 1 shows a schematic diagram illustrating a conventional phase-locked loop.

Please refer to FIG. 1, FIG. 1 shows a charge pump based phase-locked loop (PLL) including phase frequency detector (PFD), charge pump (CP), low pass filter (LPF), voltage controlled oscillator (VCO) and divider. In general, the output clock $F_{out}$ of PLL has jitter caused by the charge sharing effect of the charge pump under the condition of stable supply voltage and low noise interference. Due to the charge sharing effect occur in the charge pump, spikes will be formed at the input terminal of the VCO and after high frequency spikes pass through the low pass filter (LPF), it makes voltage fluctuation at the control input terminal of the VCO. Thus, the output frequency of the VCO is affected by input control voltage, which cause jitter at the output signal.

Figure 2:
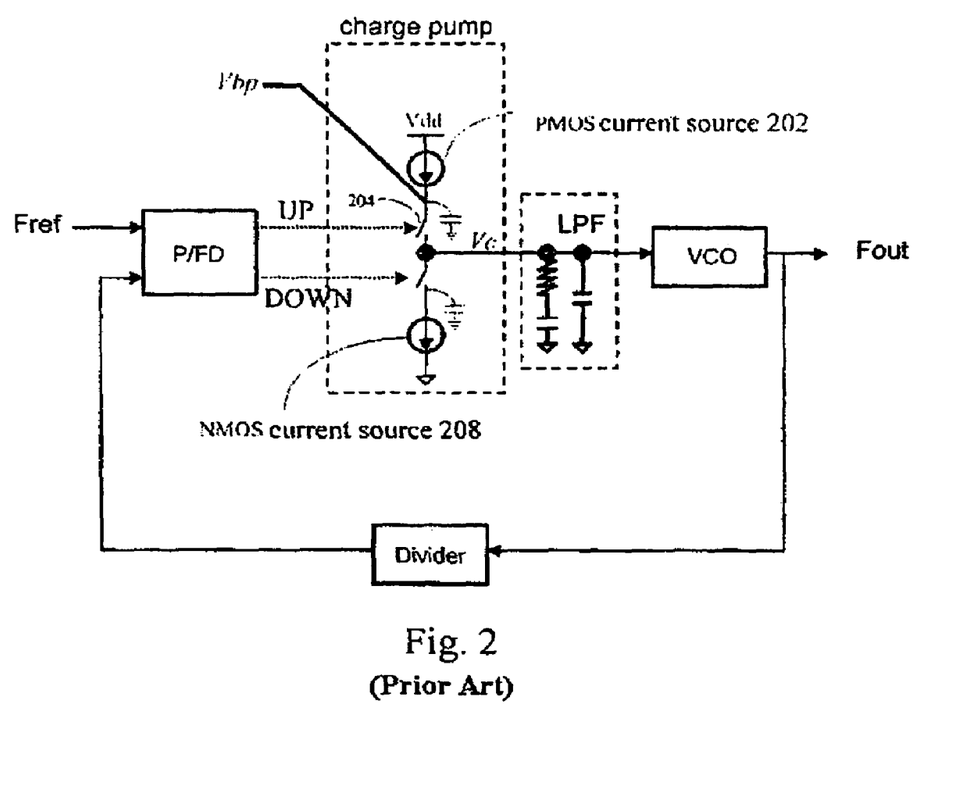
FIG. 2 shows a schematic diagram illustrating a conventional charge pump.

Charge pump includes current sources and switches. The charge sharing effect is illustrated in FIG. 2. The output of phase/frequency detector (PFD) controls the charge pump so as to increase or decrease the input voltage of the VCO. For example, in the case of the PMOS current source 202 shown in the FIG. 2, the charge sharing effect occurs when the switch 204 of the charge pump is turned off. On the other hands, there is a parasitic capacitor at the output node Vbp of the current pump and the voltage of this parasitic capacitor will be slowly charged up until power supply voltage Vdd. Therefore, when the next control signal UP turns on the switch 204, there will be an extra charge transferred into the output Vc via the switch 204. This is because that the extra charge is charged into the parasitic capacitor at the time when the switch is turned off. This extra charge causes the control voltage Vc of the VCO over the expected voltage. Thereby, it causes the phase/frequency output to exceed the expectation range. The unexpected exceeding value will be adjusted back to normal after few cycles. However, when making next adjustment, the charge sharing due to the NMOS current source 208 and switch will make the adjustment of the VCO become too low. Repeating the above-described process causes the output phase of the PLL to be up and down repeatedly and thereby causes the jitter at the output Vc.

Figure 3:
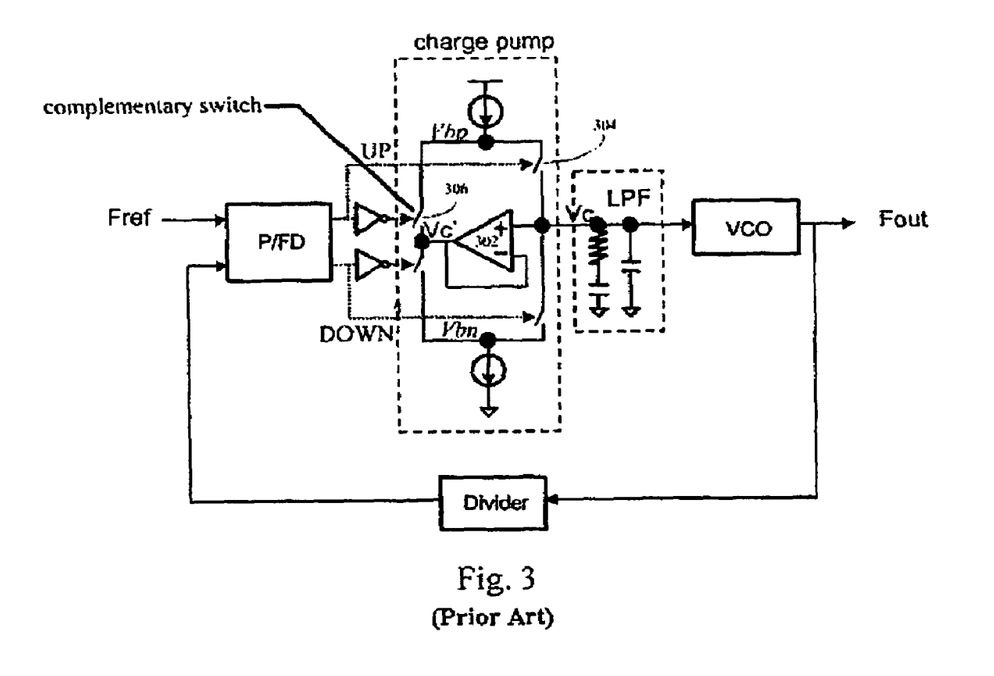
FIG. 3 shows a schematic diagram illustrating a conventional charge pump with a charge sharing removal circuit.

In the relevant arts, one way to reduce the PLL output jitter is to add a charge sharing removal circuit in the charge pump as shown in FIG. 3. In order to remove the charge sharing effect, an operation amplifier or output trans-conductance amplifier (OTA) 302 is added in the charge pump. The operation amplifier or output trans-conductance amplifier 302 receives the VCO control voltage Vc and outputs a voltage Vc' having the same voltage level as the Vc. When the charge pump switch 304 is turned off (UP=0), another inverse signal will turn on the other complementary switch 306 so that the voltage Vbp remains almost the same with the voltage Vc. Therefore, the charge sharing effect is reduced. This approach can effectively reduce the PLL output jitter, but needs additional power consumption for the OTA circuit.

Figure 4:
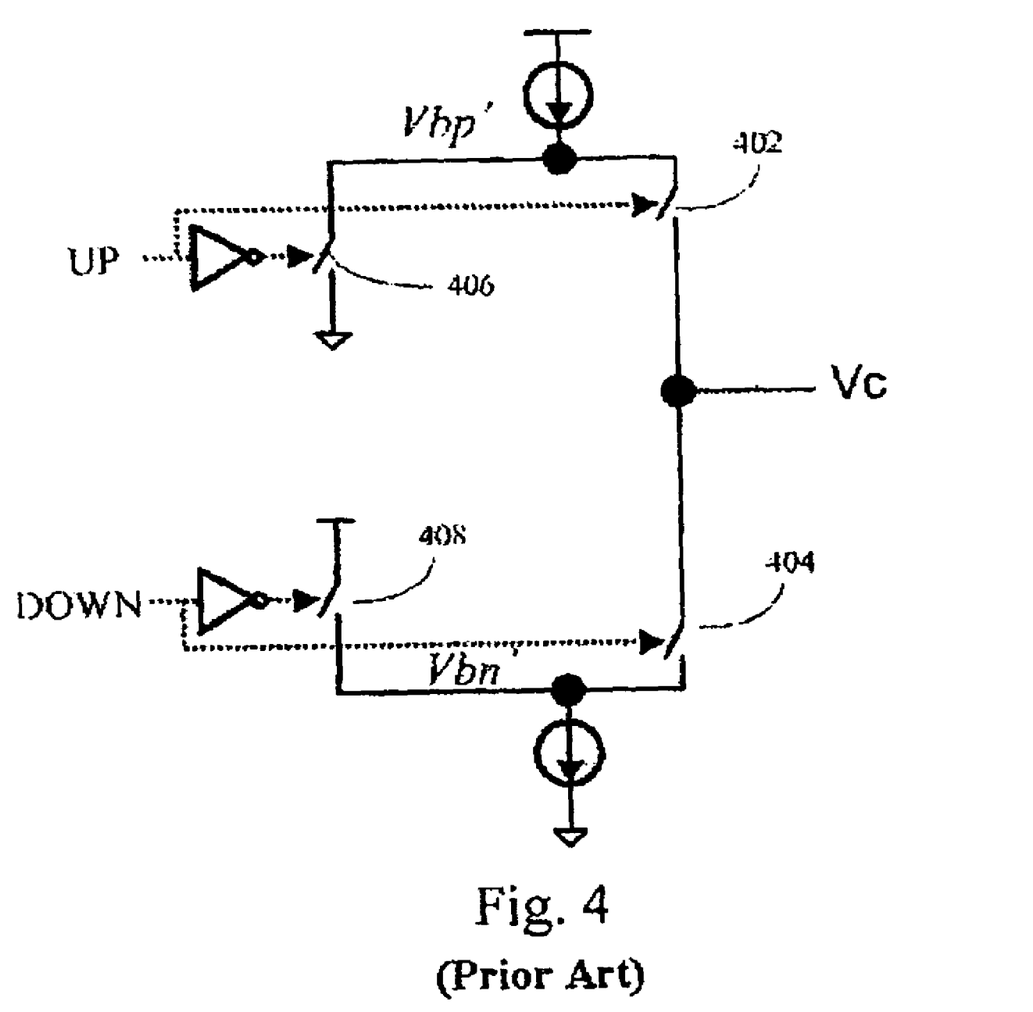
FIG. 4 shows a schematic diagram illustrating a conventional charge pump with a charge sharing eliminating control circuit.

Furthermore, in order to reduce the PLL output jitter, the method shown in FIG. 4 can be used to reduce the influence of charge sharing. When the switches 402 and 404 are turned off, the other complementary switches 406 and 408 are turned on so that the voltages Vbp' and Vbn' will be maintained at a reference voltage. The method in FIG. 4 consumes less power than that in FIG. 3, but the PLL has a larger jitter. No matter which method in FIG. 3 or FIG. 4 is used to design the PLL, it will consume more electric power than the PLL designed by using the traditional charge pump in FIG. 2. That is to say that the PLL structural consideration is a trade-off between power consumption and jitter.

BRIEF SUMMARY OF THE INVENTION

One object of the invention is to provide a charge pump with power management to obtain the advantage of flexibility controlling power consumption and jitter effect.

One embodiment of the invention discloses a charge pump comprising: a charging/discharging circuit comprising a charging current source and a discharging current source for outputting an output voltage; a voltage generator for receiving the output voltage, having an output terminal to provide the charging/discharging circuit with a first voltage so as to reduce the charge sharing effect; a reference voltage circuit for generating a reference voltage and transmitting the reference voltage to the charge/discharge circuit; a first switch coupled among the charging current source, the output terminal of the voltage generator and the reference voltage circuit; a second switch coupled among the discharging current source, the output terminal of the voltage generator and the reference voltage circuit; and, a control logic gate coupled between the first switch and the second switch for controlling operations of the first switch and the second switch.

DETAILED DESCRIPTION OF THE INVENTION

Figure 5:
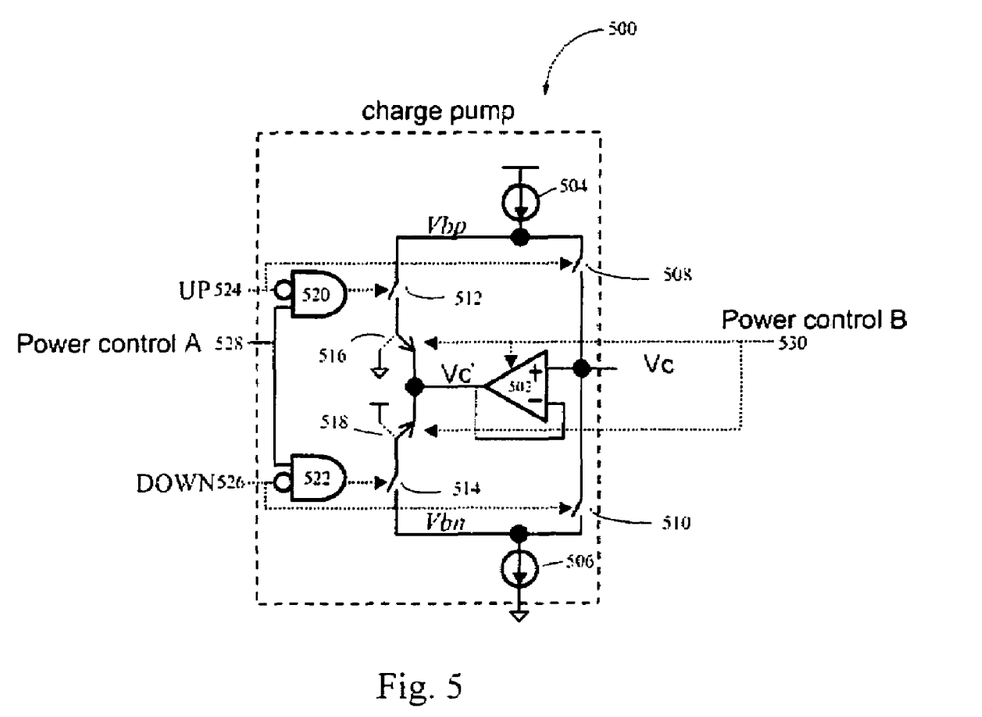
FIG. 5 shows a schematic diagram illustrating a charge pump according to one embodiment of the invention.

FIG. 5 shows the schematic diagram illustrating a charge pump 500 of a phase-locked loop having power management function according to one embodiment of the invention. The charge pump 500 includes: an operation amplifier or output trans-conductance amplifier (OTA) 502 for duplicating the output voltage Vc of the charge pump to a voltage Vc'; a charging current source 504 for charging to the voltage Vc; a discharging current source 506 for discharging from the voltage Vc; a first switch 508 for controlling the charging current source 504 to charge to the voltage Vc; a second switch 510 for controlling the discharging current source 506 to discharge from the voltage Vc; a third switch 512 for controlling the voltage of Vbp; a fourth switch 514 for controlling the voltage of Vbn; a set of complementary switch formed by the third switch 512 and the fourth switch 514; a fifth switch 516 for selecting a voltage to be transmitted to Vbp; a sixth switch 518 for selecting a voltage to be transmitted to Vbn. In the figure, when the fifth switch 516 selects a resistor R1 (presented by ground notation in FIG. 5), the voltage Vbp=I (504)×R1. Hence the voltage value of Vbp can be determined by adjusting the magnitude control resistor R1 of the fifth switch 516. Similarly, the voltage value of Vbn can be determined by adjusting the magnitude of the resistor R2 (presented by power supply notation in FIG. 5). Besides, the charge pump further includes: a first logic gate 520 and a first input signal UP 524 for controlling the first switch 508 and the third switch 512; a second logic gate 522 and a second input signal DOWN 526 for controlling the second switch 510 and the fourth switch 514; a first power supply control signal 528 (Power control A) for determining if initiating the low jitter mode; a second power supply control signal 530 (Power control B) for controlling the fifth switch 516 and the sixth switch 518 and controlling the power supply of the OTA circuit 502.

Figure 6:
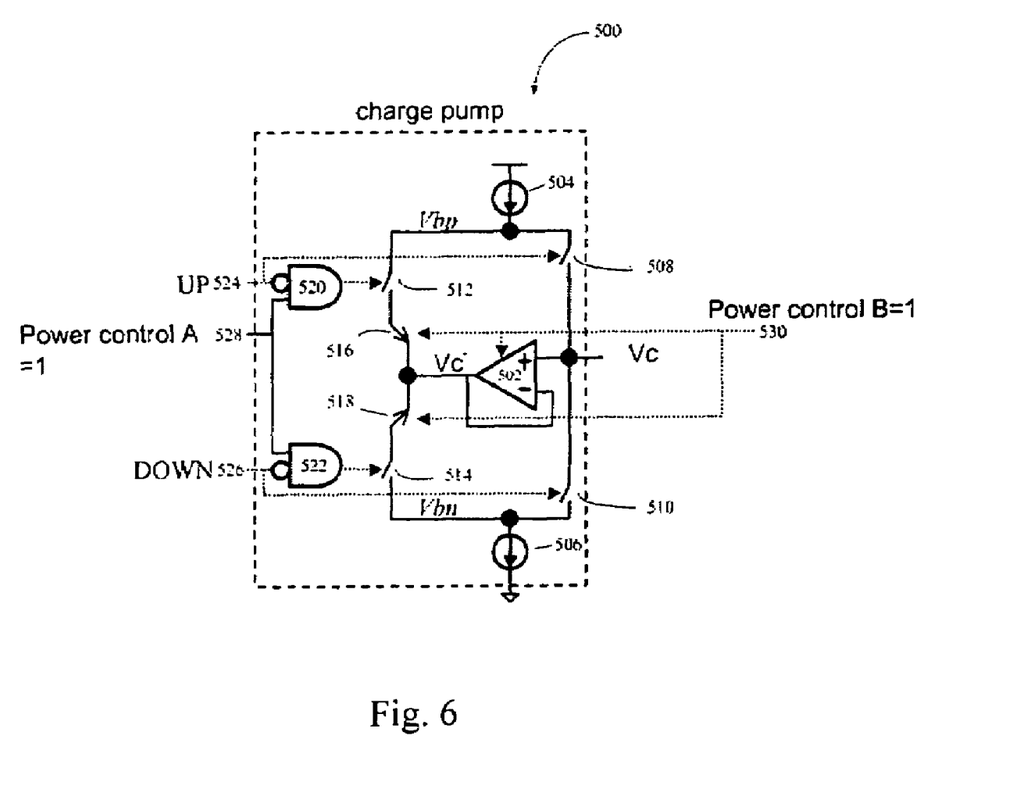
FIG. 6 shows a schematic diagram illustrating a normal mode of a charge pump according to one embodiment of the invention.

FIG. 6 shows an equivalent schematic diagram of a first power consumption mode (hereinafter referred to as "normal mode") according to one embodiment of the invention. When the first power supply control signal 528 enables the first logic gate 520 and the second logic gate 522, the second power supply control signal 530 enables the OTA circuit 502, and the fifth switch 516 and the sixth switch 518 are switched to the voltage signal of Vc'. As the input signals UP and DOWN of the charge pump are not activated, the voltage Vbp connects to the output voltage Vc' of the OTA circuit via the third switch 512 and the fifth switch 516 while Vbn connects to the output voltage Vc' of the OTA circuit via the fourth switch 514 and the sixth switch 518. Thus, the voltages of the Vbp and the Vbn are maintained at the voltage of Vc to reduce the charge sharing effect The power consumption of the normal mode is highest while the jitter is lowest. Therefore, if jitter is concerned in application, charge pump will be set into the normal mode (Power control A=1 and Power control B=1).

Figure 7:
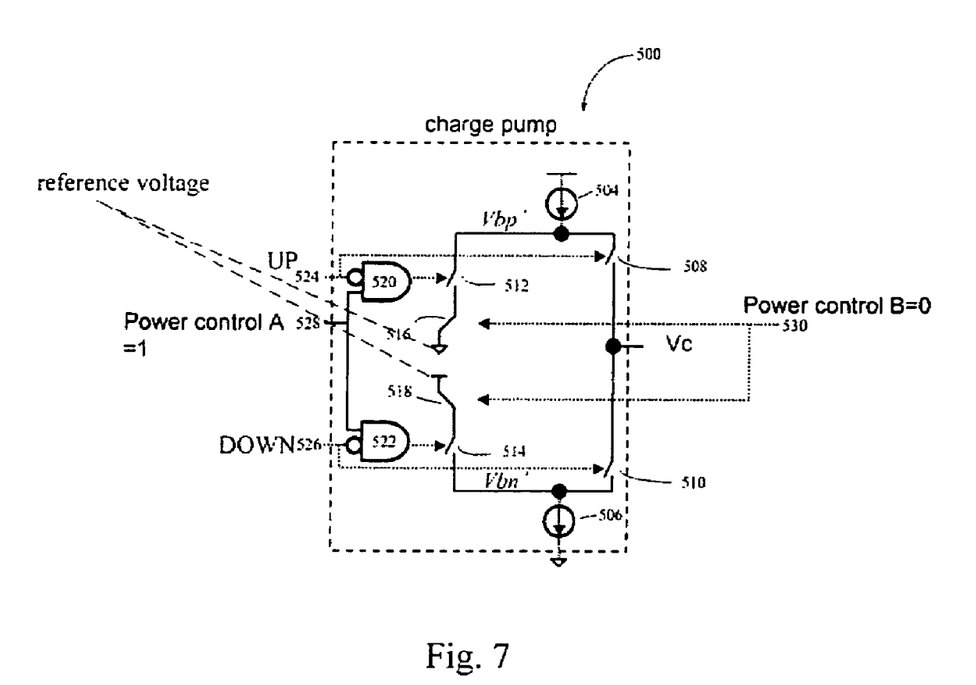
FIG. 7 shows a schematic diagram illustrating a low power mode of a charge pump according to one embodiment of the invention.

FIG. 7 shows an equivalent schematic diagram of a second power consumption mode (hereinafter referred to as "low power mode") according to one embodiment of the invention. When the first power supply control signal 528 enables the first logic gate 520 and the second logic gate 522, the second power supply control signal 530 disables the OTA circuit 502 and the fifth switch 516 and the sixth switch 518 are separately switched to a reference voltage. The reference voltage can be generated from the resistors R1 and R2 or from a reference voltage generating circuit. As the input signals UP and DOWN of the charge pump are not active, the voltage Vbp connects to a first reference voltage via the third switch 512 and the fifth switch 516 while the voltage Vbn connects to a second reference voltage via the fourth switch 514 and the sixth switch 518. Under this condition, the charge sharing effect is still reduced. The power consumption of the low power mode is lower than that of the normal mode while the jitter is larger than that of the normal mode. If jitter and power consumption are concerned in application, charge pump will be set into the low power mode (Power control A=1 and Power control B=0).

Figure 8:
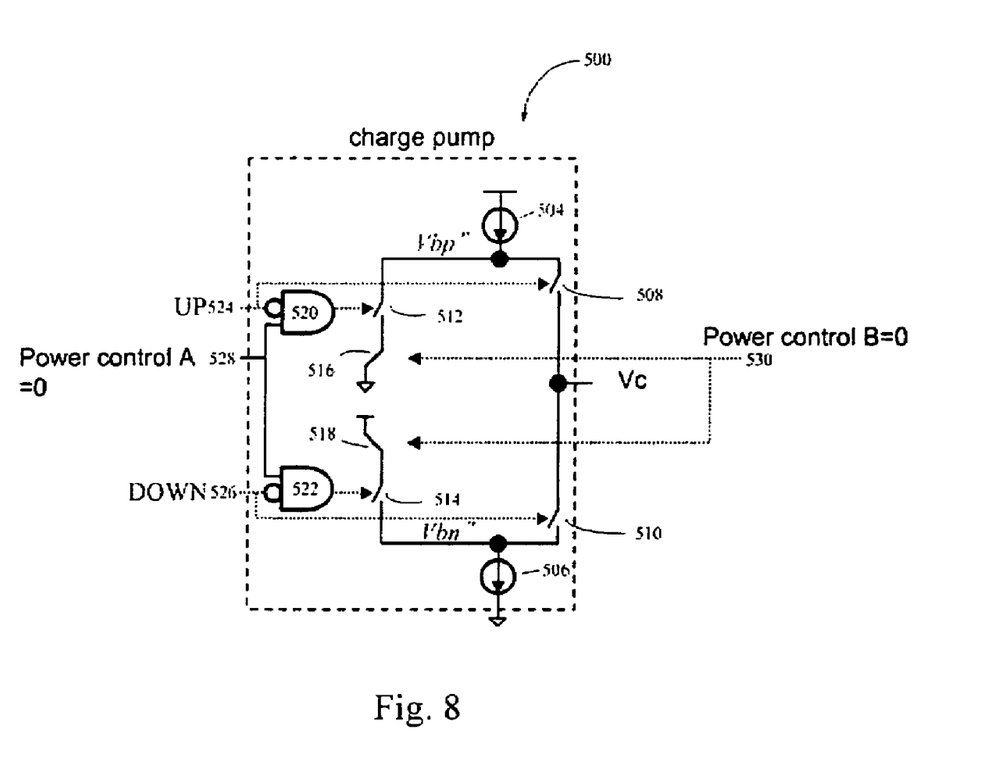
FIG. 8 shows a schematic diagram illustrating a traditional mode of a charge pump according to one embodiment of the invention.

FIG. 8 shows an equivalent schematic diagram of a third power consumption mode (hereinafter referred to as "traditional mode") according to one embodiment of the invention. When the first power supply control signal 528 disables the first logic gate 520 and the second logic gate 522, the second power supply control signal 530 disables the OTA circuit 502. As the input signals UP and DOWN of the charge pump are not active, the voltage Vbp is charged to Vdd by the charging current source 504 while Vbn is discharged to Gnd by the discharging current source 506. There is large charge sharing effect occurring at the first switch 508 and the second switch 510 so that the PLL has large jitter. The power consumption of the traditional mode is lower than that of the normal mode and that of the low power mode, while the jitter of the traditional mode is larger than the normal mode and the low power mode. Therefore, if the application system can tolerate larger jitter and needs to reduce power consumption as well, charge pump will be set into the traditional mode (Power control A=0 and Power control B=0).

Although the embodiment of the presented is applied in the Phase-Locked Loop (PLL), it also could be used in Delay-Lock Loop (DLL) and other relative applications containing charge pump circuit, those relative applications and changing are still belonging the presented invention.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A charge pump, comprising:
   a charging/discharging circuit comprising a charging current source and a discharging current source for outputting an output voltage;
   a voltage generator for receiving the output voltage, having an output terminal to provide the charging/discharging circuit with a first voltage;
   a first switch coupled between the charging current source and the output terminal of the voltage generator;
   a second switch coupled between the discharging current source and the output terminal of the voltage generator;
   a third switch coupled between the first switch and the output terminal of the voltage generator;
   a fourth switch coupled between the second switch and the output terminal of the voltage generator; and
   a control logic gate coupled to the first switch and the second switch for controlling operations of the first switch and the second switch.

2. The charge pump as claimed in claim 1, wherein a first control signal controls the control logic gate to determine an operating mode of the charge pump.

3. The charge pump as claimed in claim 2, wherein a second control signal controls an operating voltage of the voltage generator.

4. The charge pump as claimed in claim 1, wherein the charge pump is applied in a phase-locked loop (PLL) or a delay-locked loop (DLL).

5. The charge pump as claimed in claim 1, wherein a second control signal controls an operating voltage of an operation amplifier.

6. The charge pump as claimed in claim 1, wherein the voltage generator comprises an operation amplifier.

7. The charge pump as claimed in claim 1, wherein the first voltage substantially equals to the output voltage.

8. The charge pump as claimed in claim 7, wherein the voltage generator is a voltage follower.

9. A charge pump, comprising:
   a first current source for providing a first current;
   a first switch coupled to the first current source for determining whether the first current output to the output terminal of the charge pump;

a first selecting unit coupled to the first current source and receiving a first voltage and a second voltage for selectively outputting the first voltage or the second voltage to the first current source according to a power mode selection signal.

10. The charge pump as claimed in claim 9, wherein the first current source is a discharging current source.

11. The charge pump as claimed in claim 9, wherein the charge pump is applied in a phase-locked loop (PLL) or a delay-locked loop (DLL).

12. The charge pump as claimed in claim 9, further comprising:
a second current source for providing a second current;
a second switch coupled to the second current source for determining whether the second current output to the output terminal of the charge pump;
a second selecting unit coupled to the second current source and receiving the first voltage and a third voltage for selectively outputting the first voltage or the third voltage to the second current source.

13. The charge pump as claimed in claim 12, wherein the first current source is a charging current source and the second current source is a discharging current source.

14. The charge pump as claimed in claim 13, further comprising:
a voltage generator coupled to the first and the second switches and receiving the output voltage of the charge pump for generating the first voltage.

15. The charge pump as claimed in claim 14, wherein the voltage generator is an operational amplifier.

16. The charge pump as claimed in claim 9, wherein the first voltage is corresponding to the output voltage of the charge pump and the second voltage is a substantially fixed voltage.

17. The charge pump as claimed in claim 9, further comprising:
a voltage generator coupled to the first switches and receiving the output voltage of the charge pump for generating the first voltage;
wherein the first voltage is substantially equal to the output voltage of the charge pump.

18. The charge pump as claimed in claim 9, wherein the first current source is a charging current source.

* * * * *